United States Patent

[11] 3,619,056

[72] Inventors Gerald Hermann Hantusch; David Alfred Vincent; Eric Henry Van Tongerloo, all of Ottawa, Ontario, Canada
[21] Appl. No. 75,828
[22] Filed Sept. 28, 1970
[45] Patented Nov. 9, 1971
[73] Assignee Northern Electric Company Limited Montreal, Quebec, Canada

[54] PATTERN REGISTERING JIG
5 Claims, 3 Drawing Figs.

[52] U.S. Cl. ..... 355/91, 355/73, 355/87
[51] Int. Cl. ..... G03b 27/20
[50] Field of Search ..... 355/40, 53, 73, 76, 87, 91; 33/184.5

[56] References Cited

UNITED STATES PATENTS

| | | | |
|---|---|---|---|
| 2,900,735 | 8/1959 | Mier | 33/184.5 |
| 3,220,331 | 11/1965 | Evans et al. | 33/184.5 X |
| 3,280,715 | 10/1966 | Corl et al. | 355/91 X |
| 3,495,512 | 2/1970 | Vaughan | 355/53 X |

*Primary Examiner*—John M. Horan
*Assistant Examiner*—Alan Mathews
*Attorney*—John E. Mowle

ABSTRACT: A jig for accurately registering an image or pattern bearing mask on one face of a silicon slice with an existing pattern on the opposite face of the silicon slice. The face of the silicon slice which bears the existing pattern is initially registered with, placed in contact with, and held by a supporting face of a vacuum chuck. This initial registration is performed by sighting through an optically transparent portion of the chuck body and registering corresponding reference and registration marks on the silicon slice and the chuck body respectively. Following this initial registration image bearing mask is placed on the opposite face of the silicon slice so as to form a sandwich of the vacuum chuck body, silicon slice and image bearing member. When the image bearing member has also been registered with the vacuum chuck body, by sighting through the aforementioned transparent portion and aligning corresponding registration marks, the pattern bearing mask will be correctly registered with the existing pattern on the opposite face of the silicon slice.

INVENTORS
G. H. HANTUSCH
D. A. VINCENT
E. H. VAN TONGERLOO
BY John E. Mowle
PATENT AGENT INVENTORS
G. H. HANTUSCH
D. A. VINCENT
E. H. VAN TONGERLOO
BY John E. Moole
PATENT AGENT

PATTERN REGISTERING JIG

FIELD OF THE INVENTION

This invention relates to a jig for accurately registering a pattern bearing mask onto one face of a workpiece with an existing image or pattern on the opposite face of the workpiece, and more particularly to a vacuum holding jig wherein the registration is achieved by sighting through the body of a vacuum chuck onto both the workpiece and the pattern bearing mask.

DESCRIPTION OF THE PRIOR ART

It is highly desirable in many applications to accurately register an image on one face or side of a workpiece with an image on the opposite face of the same workpiece. In the fabrication of two-sided printed circuit boards, for example, it is necessary that the images associated with each face or side of the circuit board bear the correct positional relationship with respect to each other. The image on one face of the workpiece is usually obtained in the well-known manner, namely, by coating the workpiece with photosensitive reagent resistance material, prior to exposing the coated workpiece to a source of light through an image carrier or mask, bearing a desired pattern. Once the first image has been properly impressed on one face of the workpiece, however, a way must be found to properly position the second desired image onto the opposite face of the workpiece in a manner such that both images will have the correct registration with respect to each other.

In view of frequent requirements, many techniques have been developed for accurate registration of images on opposite faces of a workpiece. A notable example may be found in U.S. Pat. No. 3,156,563 issued on Nov. 10, 1964 to M. E. Harrison et al. In this patent a method of registering two images on to opposite faces of a sheet metal workpiece is shown. This method utilizes a two piece registering jig which relies on registering pins to acquire and maintain the correct registration. Another example which utilizes the registering pin technique is described in U.S. Pat. No. 3,264,105 to W. Hootz, Jr., issued on Aug. 2, 1966.

In addition to the registering pin technique, other methods are used, particularly in the manufacture of two-sided printed circuit boards. In a typical method yielding reasonable placement accuracy, two masks bearing the desired patterns are placed on top of each other, aligned, and held in position with a strip of adhesive tape along one edge. Following the aforementioned registration, the workpiece, which is usually a thin copper clad circuit board, may readily be inserted between the masks in a manner similar to inserting a blotter between the pages of a book.

These alignment techniques, which are generally satisfactory for use in chemical milling of thin sheet metals, or of two sided printed circuit boards, are, however, generally unsatisfactory when smaller workpieces and images are used, and when greater precision is required. When the workpiece in a small object, such as a silicon slice as used in the manufacture of microelectronic circuits, it is highly desirable to have a means of rigidly holding, and accurately registering the workpiece with the image bearing member or mask. One established technique, which is used to obtain the correct registration of patterns on both sides of the silicon slice, relies on the transparency of the slice to infrared radiation. The infrared technique, however, becomes impractical if the slice is relatively thick or if one side of the slice is covered with a metal film.

SUMMARY OF THE INVENTION

It has been found, in the manufacture of microelectronic circuits, that the aforementioned limitations of the infrared method as well as the limitations of other established techniques may be overcome by using a supporting and registering jig wherein the registration is achieved by sighting through the supporting portion of the jig onto both the workpiece and the image bearing mask.

Thus, in accordance with the present invention the supporting and registering jig comprises a vacuum chuck body with supporting surface for supporting and holding a first working surface of a workpiece. This supporting surface is provided with an aperture suitably located thereon. This aperture is adapted for connection to a source of suction in order that the workpiece may be secured to the vacuum chuck body. An optically transparent portion traverses the body of the vacuum chuck in a direction substantially normal to the supporting surface and is provided with a first and a second registration mark. The first registration mark has a form complemental to a reference mark on the first working surface of the workpiece for alignment of the first working surface of the workpiece with the supporting surface of the vacuum chuck body. In cooperation with the vacuum chuck body, the alignment jig further comprises an image carrying member having an image bearing surface with a third registration mark thereon. This third registration mark has a form complemental to the second registration mark on the optically transparent portion to permit alignment of the image carrying member with the supporting surface of the vacuum chuck body. By sighting through the optically transparent portion of the vacuum chuck body and aligning the first reference mark and the third registration mark with the first and second registration marks respectively, both the workpieces and the image bearing member may be registered with the supporting surface of the vacuum chuck body.

Using the supporting and registering jig of the present invention and a standard laboratory microscope, registration of images on opposite faces of a workpiece can easily be achieved with silicon slices thicker than the maximum practical thickness permissable with the infrared method. Furthermore, unlike the infrared method, the presence of a metal film layer on one side of the silicon slice does not preclude using the invention.

A significant advantage of the alignment jig lies in its ease of operation, as an operator may readily obtain the desired registrations by sighting only in one direction, namely through the optically transparent portion of the vacuum chuck body. Using a vacuum chuck to hold the first working surface of the workpiece presents a further advantage by eliminating a possible source of contamination, resulting from the usual holding means such as wax or gum.

BRIEF DESCRIPTION OF THE DRAWINGS

An example of one embodiment of the invention will now be described with reference to the accompanying drawing in which.

DESCRIPTION OF THE PREFERRED EMBODIMENT

Figure 1:
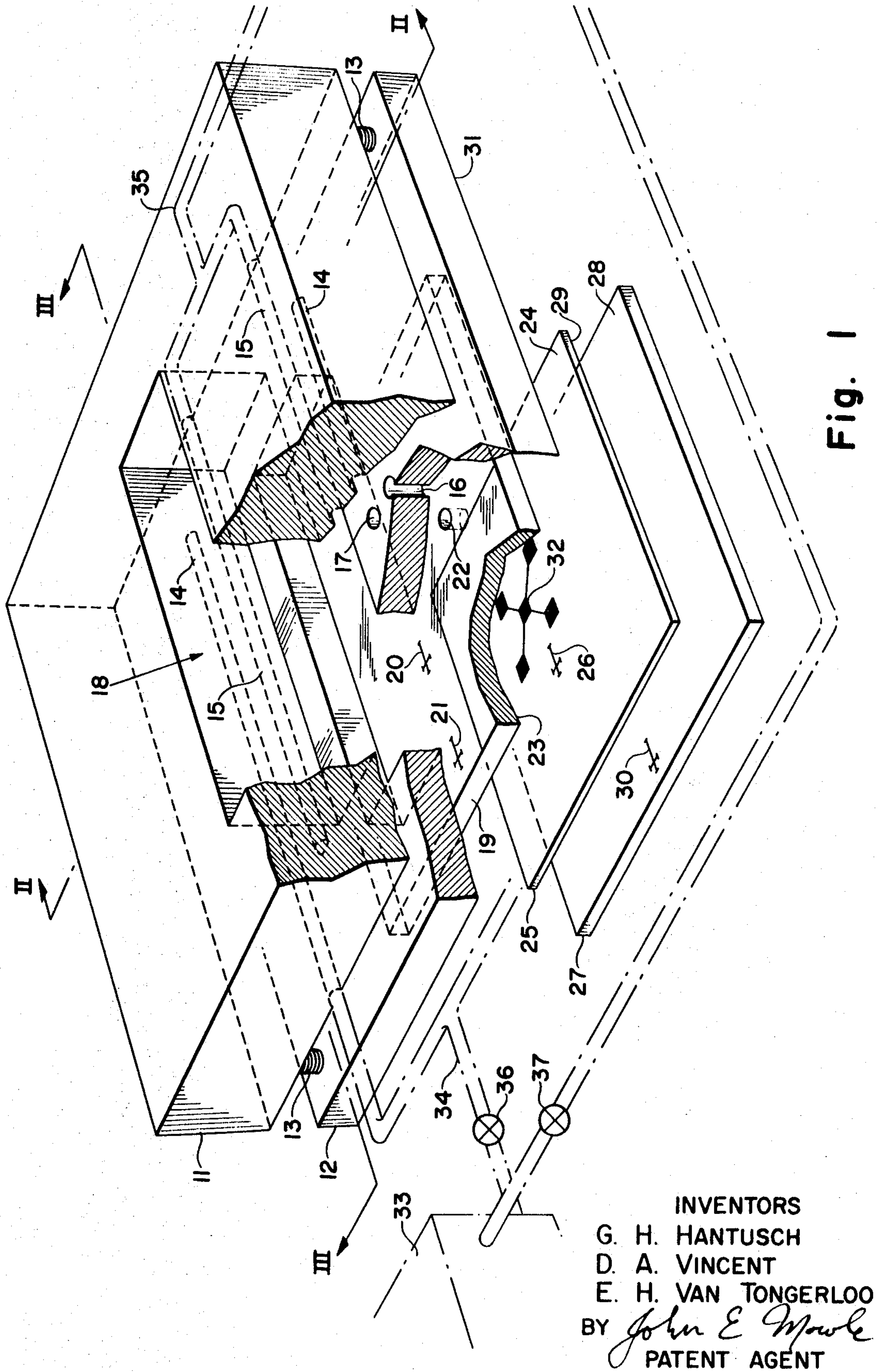
FIG. 1 is an exploded view of a supporting and registering jig in accordance with the present invention.
Figure 2:
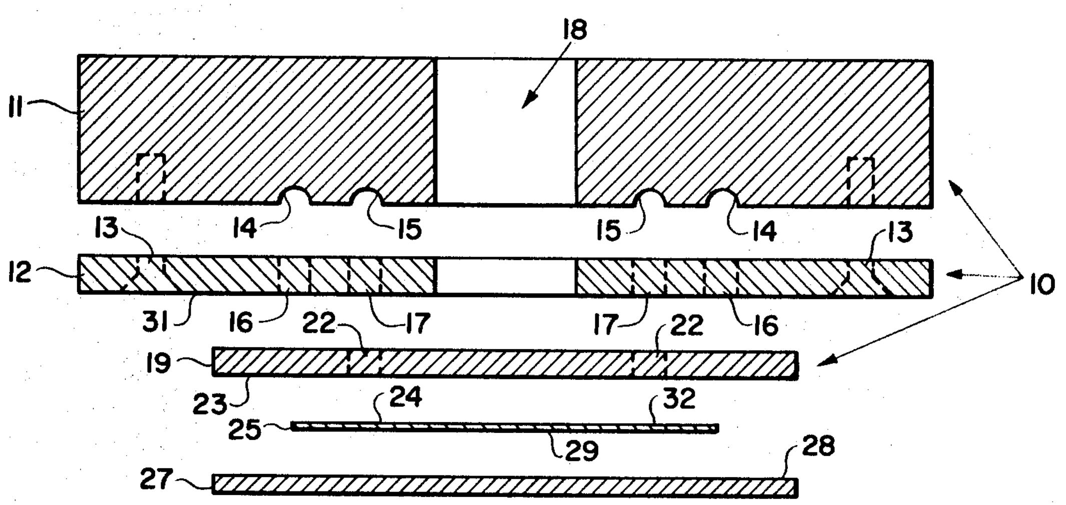
FIG. 2 is a cross-sectional view taken along the line II—II of FIG. 1.
Figure 3:
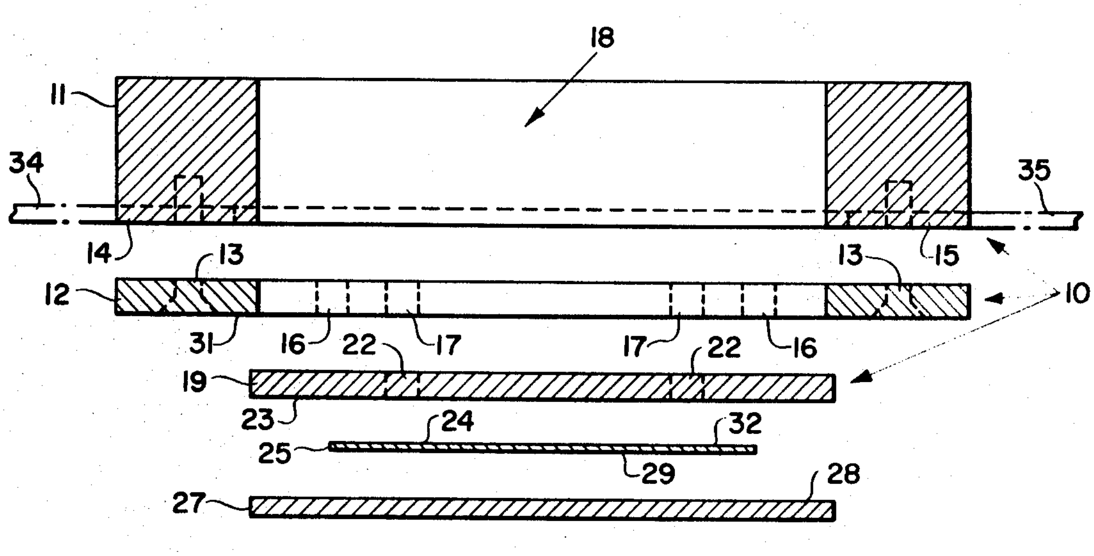
FIG. 3 is a cross-sectional view taken along the line III—III of FIG. 1.

Referring to FIGS. 1, 2 and 3, the supporting and registering jig comprises a vacuum chuck body generally 10 having a transparent mask 19 overlying a frontpiece 12 which is fastened to a backpiece 11 by means of screws 13. The backpiece 11 has two sets of machined grooves, an outer set 14 and an inner set 15 which are adapted for independent connection to a source of suction 33. The frontpiece 12 has two sets of holes, an outer set 16 arranged to overlie the outer set of grooves 14 of the backpiece 11 and an inner set 17 arranged grooves overlie the inner set of grooves 15 of the backpiece 11.

An opening 18, which is shown as rectangular in form in FIG. 1, traverses the backpiece 11 and the frontpiece 12 so as to permit an unobstructed view on to the transparent mask 19. The transparent mask 19 which extends over the front face 31 of the frontpiece 12 in a manner so as to overlie the outer set of holes 16 is provided with a first registration mark 20 and a second registration mark 21. A set of holes or apertures 22 on the transparent mask 19 are aligned with the inner set of holes 17 of the frontpiece 12, and ultimately with the inner grooves 15 of the backpiece 11 to determine the registration of the transparent mask 19 with the respect to the frontpiece 12. The transparent mask 19 is held in intimate contact with the front face 31 of the frontpiece 12 by means of a vacuum created at the outer set of holes 16 when the outer set of grooves 14 of the backpiece 11 are connected to the source of suction 33 via tubing 34 and valve 36.

The transparent mask 19 has a supporting surface 23 intended to be placed in intimate contact with the first working surface 24 of a workpiece 25. This surface 24 of the workpiece 25 is further provided with a reference mark 26 for registration with the first registration mark 20 on the transparent mask 19. An image bearing member 27, usually a small glass plate with an image bearing surface 28 is placed in intimate contact with the second working surface 29 of the workpiece 25 and registered with the transparent mask 19 by aligning the second registration mark 21 of a transparent mask 19 with the third registration mark 30 of the image bearing member 27.

It is to be understood that the reference mark 26 on the first working surface 24 of the workpiece 25 as well as the third registration mark 30 on the image bearing surface 28 of image bearing member 27 must be compatible in form and portion with the first registration mark 20 and the second registration mark 21 of the transparent mask 19 respectively.

The operation of the preferred embodiment as outlined in FIGS. 1 to 3 inclusive may be described as follows:

At the time the first image 32 is formed on the first working surface 24 of the workpiece 25, the reference mark 26 is formed on the first working surface 24 with a form and position compatible with the first registration mark 20 on the transparent mask 19 which is to be used with the workpiece 25. Furthermore, as the image bearing member 27 must be compatible with the workpiece 25 and the transparent mask 19, it must bear a third registration mark 30 in a location permitting registration with the second registration mark 21 of the transparent mask 19.

When a transparent mask 19 has been selected, which is compatible with workpiece 25, the transparent mask is placed in contact with the front face 31 of the frontpiece 12, and is registered with frontpiece 12 by aligning apertures 22 of the transparent mask 19 with the inner set of holes 17 on the frontpiece 12. After the transparent mask 19 is registered with the frontpiece 12, it is held firmly in position by means of a vacuum created at the outer set of holes 16 by connecting the outer set of grooves 14 to the source of suction 33. Once the transparent mask has been selected, aligned and secured on the frontpiece 12, the first working surface 24 of the workpiece 25 is placed in contact with the supporting surface 23 of the transparent mask 19. By sighting through rectangular opening 18, the first registration mark 20 on the transparent mark 19 is registered with the reference mark 26 on the first working surface 24 of the workpiece 25. Following the alignment of the workpiece and the transparent mask 19, a vacuum is generated through the inner set of holes 17 on the frontpiece 12 and on through the corresponding apertures 22 of the transparent mask 19 to fix the registration established. The vacuum which is used to maintain registration of the workpiece 25 and the transparent mask 19 is established by connecting the inner set of grooves 15 of the backpiece 11 to the source of suction 33 via tubing 35 and valve 37.

After the registration of the workpiece 25 and the transparent mask 19, the image bearing member 27 is placed with its image bearing surface 28 in contact with the second working surface 29 of the workpiece 25. The exact placement of the image bearing member 27 relative to the workpiece 25 is established by sighting through rectangular opening 18 and aligning the second registration mark 21 of the transparent mask 19 with the third registration mark 30 of the image bearing member 27.

It can be seen that a desired image on a image bearing member 27 can be accurately and readily registered on the second working surface 29 of the workpiece 25 with respect to an existing first image 32 on the opposite face (first working surface 24) of the workpiece 25 by using the supporting and registering jig described. This registration is achieved by sighting through the optically transparent portion 18 of the chuck body 15 (shown in FIG. 1 as rectangular opening 18) and aligning both the workpiece 25 and the image bearing member 27 (Or mask) with the transparent mask 19.

Although, in the embodiment illustrated, rectangular opening 18 defines in part the optically transparent portion of the vacuum chuck body 10, alternative embodiments could use one or more openings of different cross section. Alternatively, if desired, the entire body 10 could be made of an optically transparent material.

What is claimed is:

1. A jig for supporting and registering with a workpiece having first and second opposed working surfaces, the first working surface having a reference mark thereon, the jig comprising in combination:

a vacuum chuck body having a supporting surface for supporting the first working surface of the workpiece;

the supporting surface having an aperture, communicating with an exhaust port for connection to a source of suction, and located so as to permit vacuum holding of the workpiece;

the chuck body having an optically transparent portion transversing therethrough in a direction substantially normal to the supporting surface;

a first and second registration mark located on the optically transparent portion, the first registration mark having a form and position complemental to the reference mark on the first working surface for alignment of the first working surface of the workpiece with the supporting surface; and an image carrying member having an image bearing surface with a third registration mark thereon, the third registration mark having a form and position complemental to the second registration mark for alignment of the image carrying member and the vacuum chuck body;

thereby permitting optical registration of the workpiece and the image carrying member with the vacuum chuck body through the optically transparent portion of said body when the workpiece is sandwiched between the vacuum chuck body and the image carrying member.

2. The jig as defined in claim 1 wherein the supporting and the image bearing surfaces are substantially planar, and the first and second working surfaces are substantially planar and parallel.

3. The jig as claimed in claim 1 wherein the image carrying member is a photographic plate.

4. The jig as defined in claim 1 wherein the optically transparent portion extends over the entire supporting surface of the vacuum chuck body.

5. The jig as defined in claim 1 wherein the vacuum chuck body includes a transparent mask to provide the supporting surface and to locate the first and second registration marks.

* * * * *

UNITED STATES PATENT OFFICE
CERTIFICATE OF CORRECTION

Patent No. 3,619,056 Dated November 9, 1971

Inventor(s) Gerald Hermann Hantusch et al.

It is certified that error appears in the above-identified patent and that said Letters Patent are hereby corrected as shown below:

On the cover sheet [73] "Northern Electric Company Limited" should read -- Microsystems International Limited --.

Signed and sealed this 30th day of May 1972.

(SEAL)
Attest:

EDWARD M.FLETCHER,JR.
Attesting Officer

ROBERT GOTTSCHALK
Commissioner of Patents